United States Patent
Yeh et al.

(10) Patent No.: US 7,303,960 B1
(45) Date of Patent: Dec. 4, 2007

(54) METHOD FOR FABRICATING FLASH MEMORY DEVICE

(75) Inventors: Chang-Ho Yeh, Taipei (TW);
Chang-Ming Wu, Taipei County (TW);
Jhong-Ciang Min, Taipei County (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 0 days.

(21) Appl. No.: 11/695,052

(22) Filed: Apr. 1, 2007

(30) Foreign Application Priority Data

Mar. 9, 2007 (TW) .............................. 96108301 A (51) Int. Cl.
*H01L 21/8247* (2006.01)

(52) U.S. Cl. .................. 438/267; 257/E21.179
(58) Field of Classification Search ........ 438/257–267; 257/E21.179
See application file for complete search history.

(56) References Cited

U.S. PATENT DOCUMENTS 5,063,172 A * 11/1991 Manley ....................... 438/265
5,073,513 A * 12/1991 Lee ............................. 438/267

* cited by examiner

*Primary Examiner*—Richard A. Booth
(74) *Attorney, Agent, or Firm*—Winston Hsu (57) ABSTRACT

A method for fabricating a flash memory device including the steps of: providing a substrate having thereon a gate with therein a control gate; lining the substrate and the gate with a liner; forming a silicon layer on the liner; forming a sacrificing layer on the silicon layer; etching the sacrificing layer to expose a portion of the silicon layer; removing the exposed silicon layer to expose a portion of the liner; removing the sacrificing layer; forming a spacer layer on the substrate covering the remaining silicon layer and the exposed liner; etching the spacer layer to form a spacer on sidewall of the gate; and removing the silicon layer that is not covered by the spacer thereby forming floating gate on sidewall of the gate.

6 Claims, 11 Drawing Sheets

ABRICATING FLASH
METHOD FOR FABRICATING FLASH MEMORY DEVICE

BACKGROUND OF THE INVENTION

1. Field of the Invention

The present invention relates to a method for fabricating a flash memory device, and more particularly, to a method for fabricating a memory transistor having floating gates disposed on vertical sidewalls of a control gate thereof.

2. Description of the Prior Art

Flash memory is known in the art. Flash memory is non-volatile, which means that it does not need power to maintain the information stored in the chip. In addition, flash memory offers fast read access times and better kinetic shock resistance than hard disks. Those characteristics explain the popularity of flash memory for applications of memory storage including digital audio players, digital camera, mobile cell phone, and USB flash drivers, etc.

Figure 1:
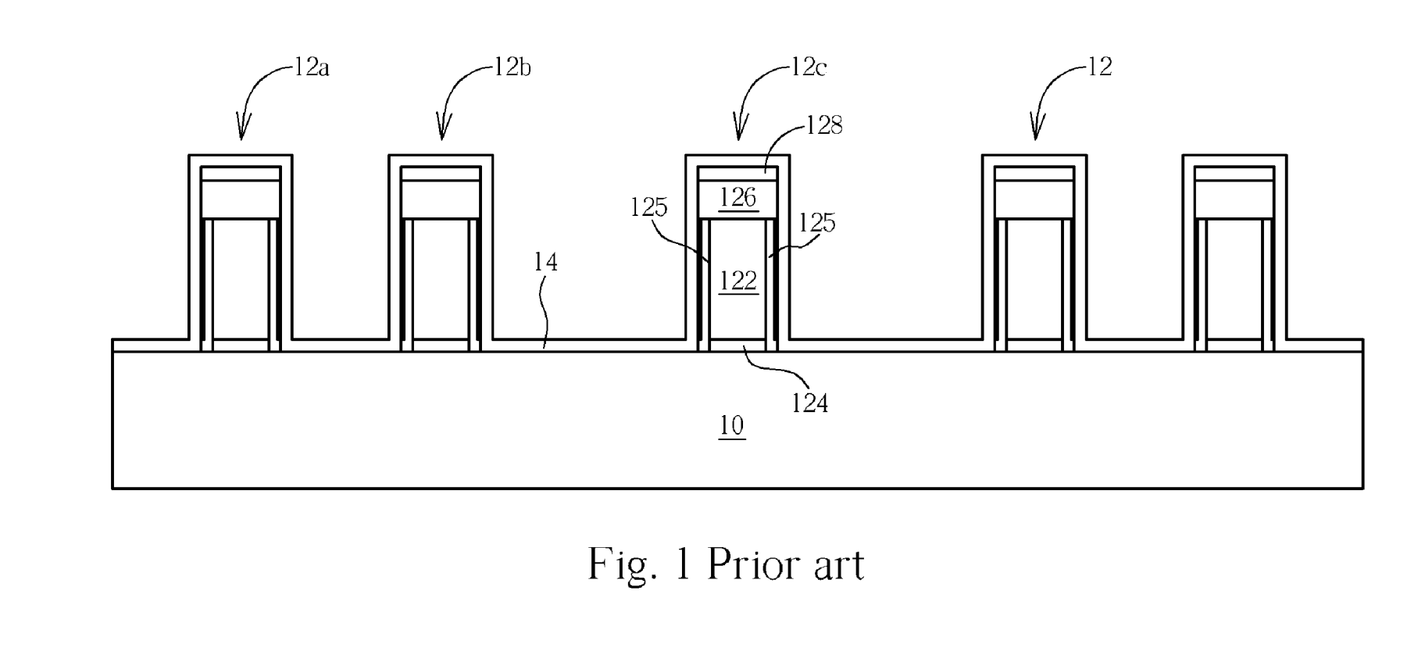
FIGS. 1-4 illustrate a prior art method for fabricating floating gates of a flash memory device.

FIGS. 1-4. illustrate a conventional method for fabricating floating gates on sidewalls of a control gate of a flash memory device. As shown in FIG. 1, a plurality of gate structures 12 are formed on a substrate 10. The substrate 10 may be a bulk semiconductor such as silicon substrate, but not limited thereto. Each gate structure 12 comprises a gate conductive layer 122, a gate dielectric layer 124 between the gate conductive layer 122 and the substrate 10, a dielectric layer 126, a polysilicon cap layer 128 on the dielectric layer 126, and an insulator layer 125 on the vertical sidewalls of the gate conductive layer 122.

The gate conductive layer 122 may comprise doped polysilicon. The gate dielectric layer 124 may comprise silicon oxide layer. The insulator layer 125 may comprise combinations of nitride silicon and silicon oxide layer, for example, oxide-nitride-oxide (ONO) dielectric layer. The dielectric layer 126 on the gate conductive layer 122 may be a silicon oxide layer.

The aforesaid gate structures 12 comprise adjacent gate 12a, gate 12b and gate 12c. The gate 12b is between the gate 12a and gate 12c, and the gate 12b is closer to the gate 12a than to the gate 12c. A liner 14 is then formed on the surface of the substrate 10 and the gate structures 12.

Figure 2:
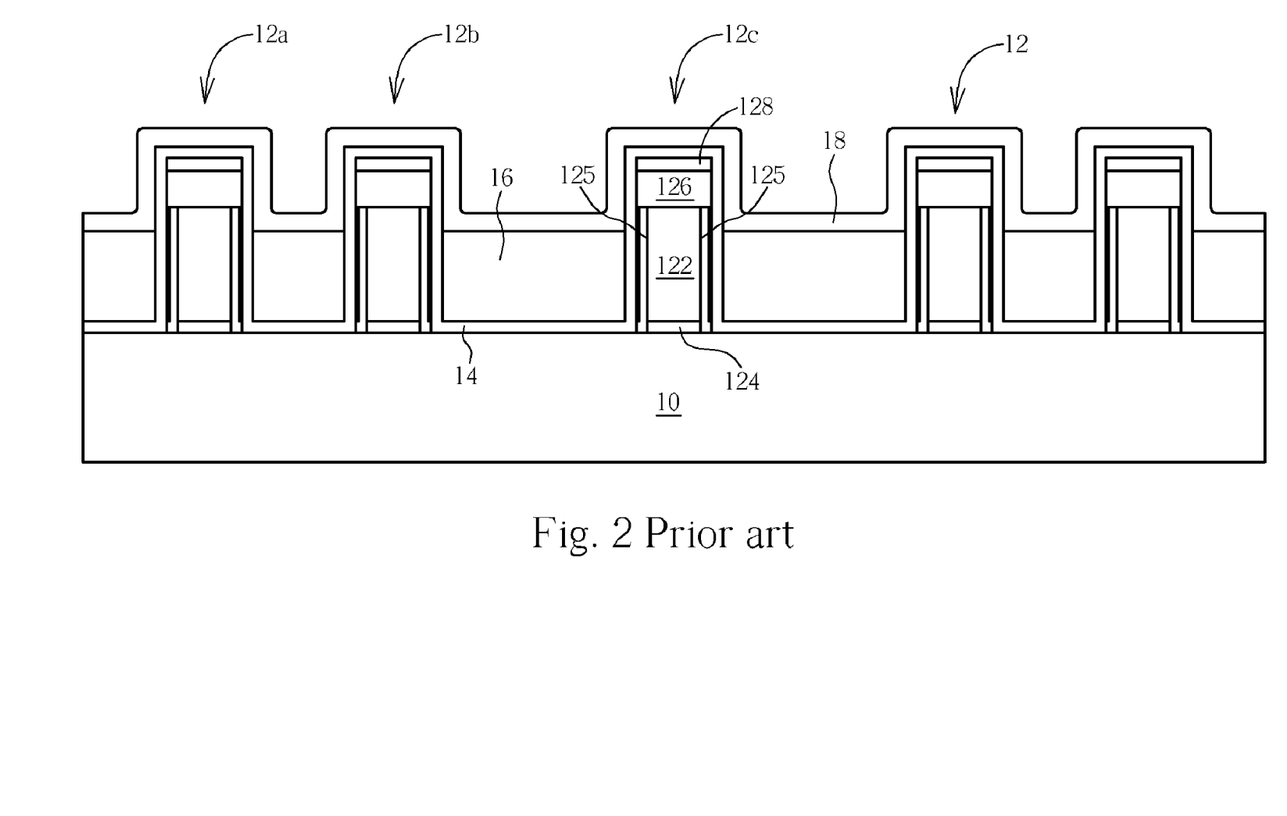

As shown in FIG. 2, a polysilicon layer 16 is blanket deposited on the surface of the substrate 10. The polysilicon layer 16 covers the gate structures 12 and fills the spacing between the gate structures 12. Thereafter, the polysilicon layer 16 is etched until the top surface of the polysilicon layer 16 is lower than the top of the gate conductive layer 122. At this point, as indicated in FIG. 2, the gate structures 12 protrude from the top surface of the polysilicon layer 16 by a predetermined height.

Subsequently, a chemical vapor deposition (CVD) process is carried out to blanket deposit a silicon nitride layer 18 on the substrate 10 to cover the top surface of the polysilicon layer 16 and the protruding top portions of the gate structures 12.

Figure 3:
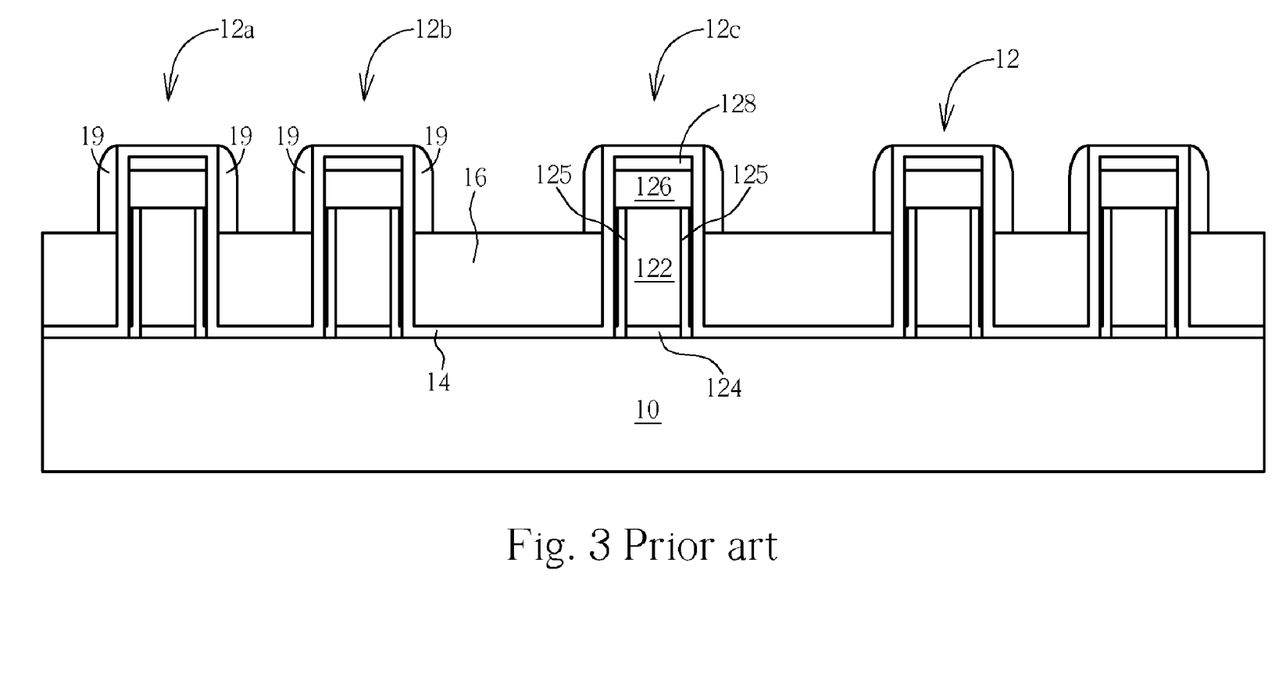

As shown in FIG. 3, an anisotropic etching process is carried out to etch the silicon nitride layer 18 until the polysilicon layer 16 and the liner 14 are exposed, thereby forming silicon nitride spacers 19 on sidewalls of the protruding top portions of the gate structures 12.

Figure 4:
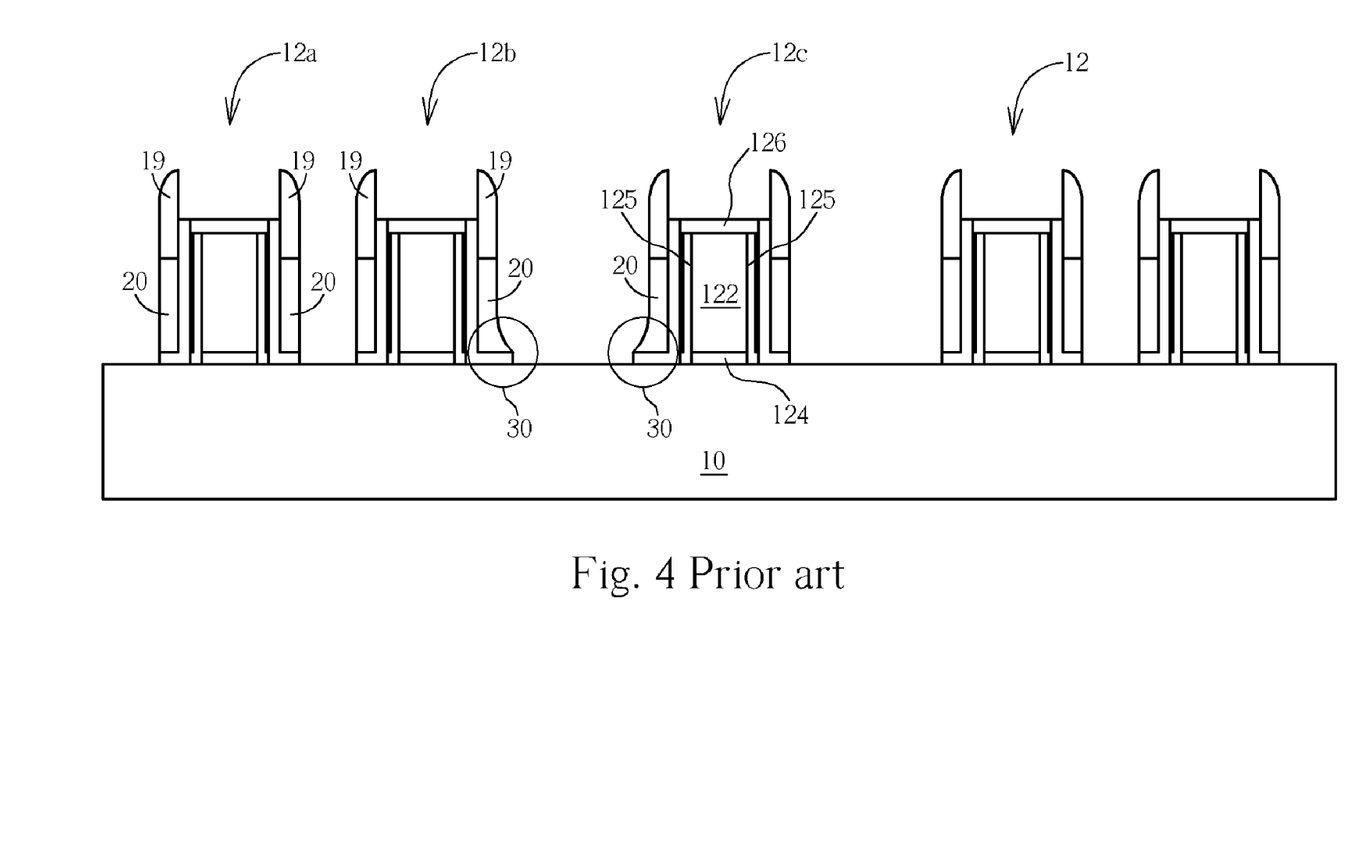

As shown in FIG. 4, using the silicon nitride spacer 19 as an etch mask, a dry etching process is performed to etch polysilicon layer 16 and the liner 14 so as to form self-aligned floating gates 20 on sidewalls of the gate structures 12, meanwhile the polysilicon cap layer 128 and part of the dielectric layer 126 above the gate structures 12 are etched away, resulting in a recessed top profile of the gate structures 12.

One drawback of the above-described conventional process for fabricating the sidewall floating gate by using the silicon nitride spacer 19 as mask to etch the polysilicon layer 16 is that the resultant floating gates may have so-called tailing defects, as specifically indicated by circles 30 in FIG. 4. The gate structures 12 are normally not evenly distributed on a wafer which leads to different etching environments across the wafer and thus different etching profiles of the floating gates. For example, the distance between the gate 12b and the gate 12c is larger than between the gate 12b and the gate 12a. This causes the difficulty of the etching recipe control and a vertical sidewall profile (especially at the bottom) of the floating gate 20 becomes a real challenge.

Furthermore, when etching the floating gates, a thickness of the silicon nitride spacer 19 is concurrently etched away. Thus, it is difficult to precisely control the thickness and the profile of the floating gate 20, leading to undesired thickness variation of the floating gates. It would thus be highly desirable to provide an improved method for fabricating floating gates on sidewalls of a control gate of a memory transistor in order to avoid these drawbacks.

SUMMARY OF THE INVENTION

It is therefore a primary objective of the claimed invention to provide an improved method for fabricating flash memory device to solve the above-mentioned problems and drawbacks.

According to the claimed invention, there is provided a method for fabricating flash memory device that comprises steps of providing a substrate having thereon a gate with therein a control gate; lining the substrate and the gate with a liner; forming a silicon layer on the liner; forming a sacrificing layer on the silicon layer; etching the sacrificing layer to expose a portion of the silicon layer; removing the exposed silicon layer to expose a portion of the liner; removing the sacrificing layer; forming a spacer layer on the substrate covering the remaining silicon layer and the exposed liner; etching the spacer layer to form a spacer on sidewall of the gate; and removing the silicon layer that is not covered by the spacer thereby forming floating gate on sidewall of the gate.

These and other objectives of the present invention will no doubt become obvious to those of ordinary skill in the art after reading the following detailed description of the preferred embodiment that is illustrated in the various figures and drawings.

DETAILED DESCRIPTION

Please refer to FIGS. 5-11, which illustrate a method for fabricating floating gates on sidewalls of a flash memory according to one preferred embodiment of this invention, where like numeral numbers designate like elements, regions or layers.

Figure 5:
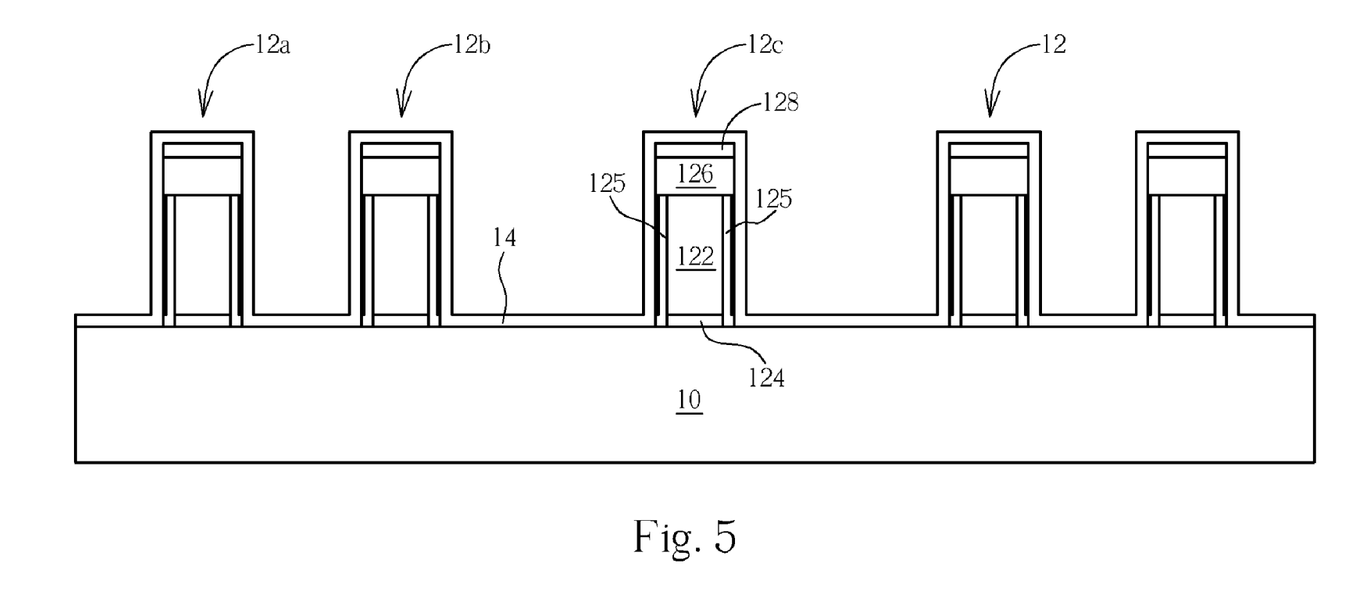
FIGS. 5-11 illustrate a method for fabricating sidewall floating gates of a flash memory device according to the preferred embodiment of this invention.

As shown in FIG. 5, a plurality of gate structures 12 are formed on a substrate 10. The substrate 10 may be a bulk semiconductor such as silicon substrate, but not limited thereto. Each gate structure 12 comprises a gate conductive layer 122, a gate dielectric layer 124 between the gate conductive layer 122 and the substrate 10, a dielectric layer 126, a polysilicon cap layer 128 on the dielectric layer 126, and an insulator layer 125 on the vertical sidewalls of the gate conductive layer 122. The gate conductive layer 122 is used as a control gate of the flash memory device.

The gate conductive layer 122 may comprise doped polysilicon. The gate dielectric layer 124 may comprise silicon oxide layer. The insulator layer 125 may comprise combinations of nitride silicon and silicon oxide layer, for example, oxide-nitride-oxide (ONO) dielectric layer. The dielectric layer 126 on the gate conductive layer 122 may be a silicon oxide layer.

Likewise, the aforesaid gate structures 12 comprise adjacent gate 12a, gate 12b and gate 12c. The gate 12b is between the gate 12a and gate 12c, and the gate 12b is closer to the gate 12a than to the gate 12c. A liner 14 such as silicon oxide layer is then formed on the surface of the substrate 10 and the gate structures 12.

Figure 6:
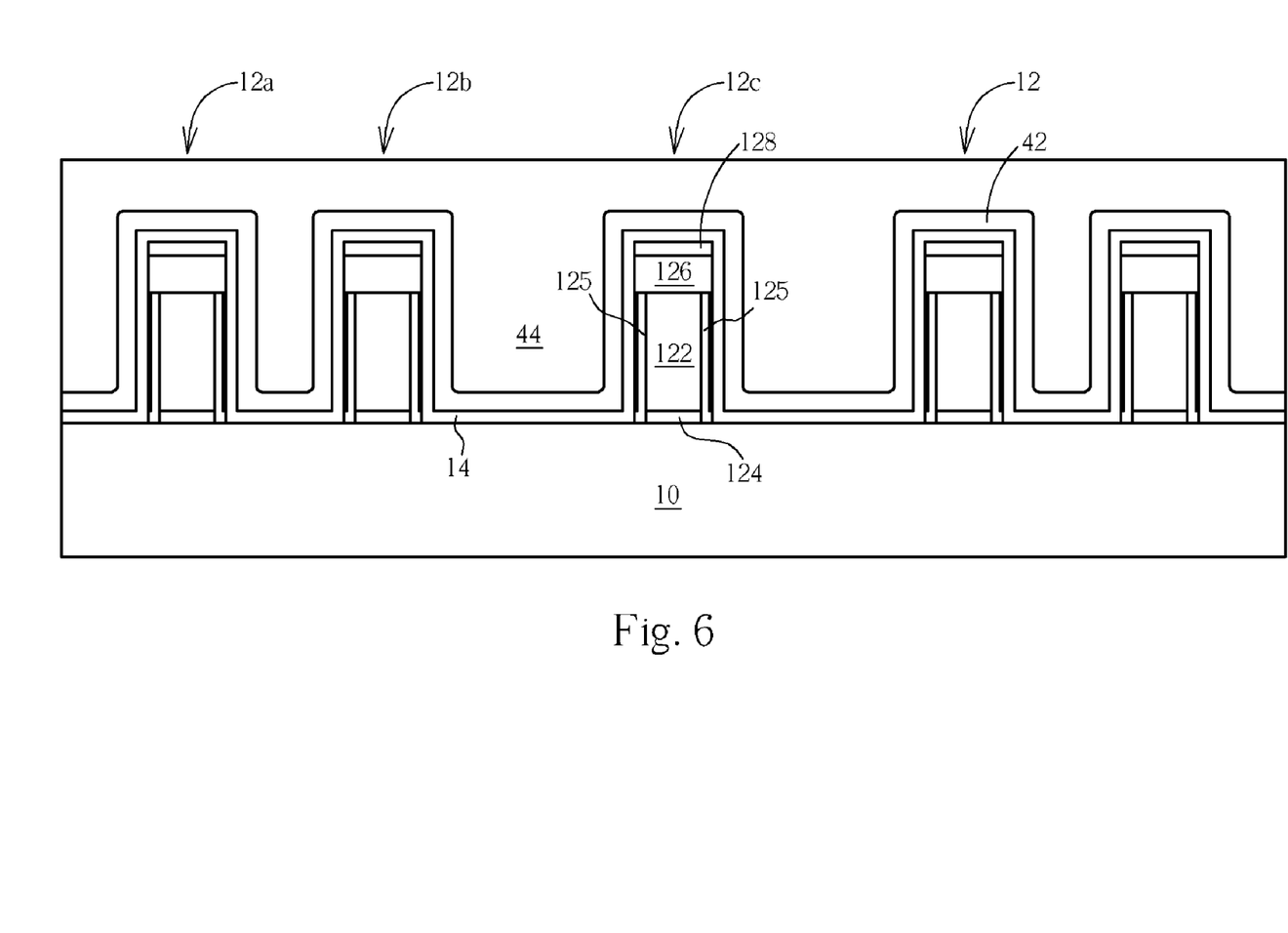

As shown in FIG. 6, a conformal polysilicon layer 42 is blanket deposited on the surface of the substrate 10 and covers the liner 14. According to preferred embodiment of this invention, the polysilicin layer 42 has a thickness ranging between 50 Å and 500 Å. The polysilicin layer 42 does not fill the spacing between the gate structures 12.

Subsequently, a sacrifying layer 44 such as photoresist is coated on the surface of the polysilicon layer 42. The sacrifying layer 44 fills into the spacing between the gate structures 12 and covers the gate structures 12.

Figure 7:
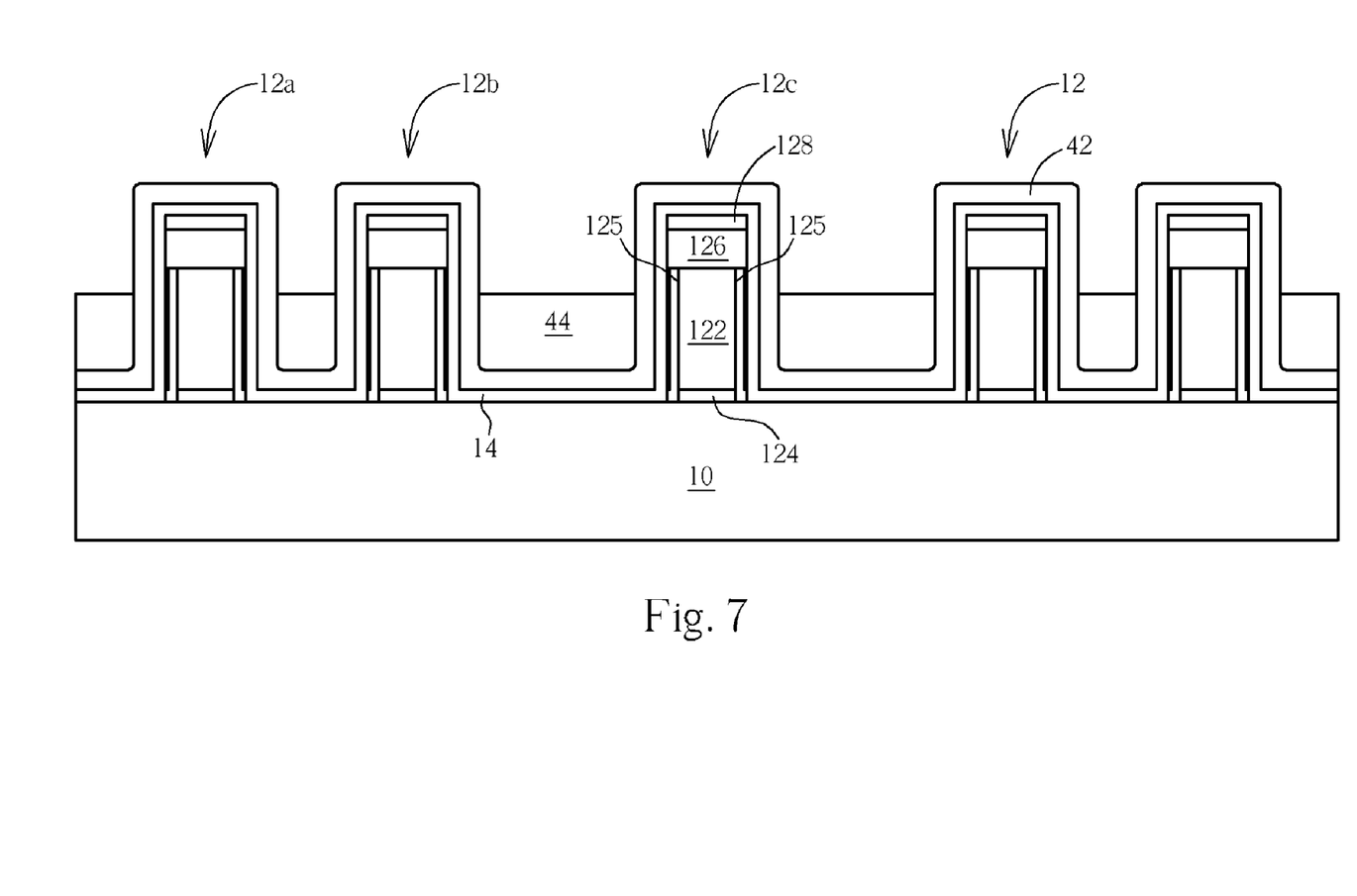

As shown in FIG. 7, an etching process is carried out to etch the sacrifying layer 14 until the polysilicon layer 42 above the gate structures 12 is exposed. At this point, top portions of the gate structures 12 protrude from the sacrifying layer 44 by a predetermined height.

Figure 8:
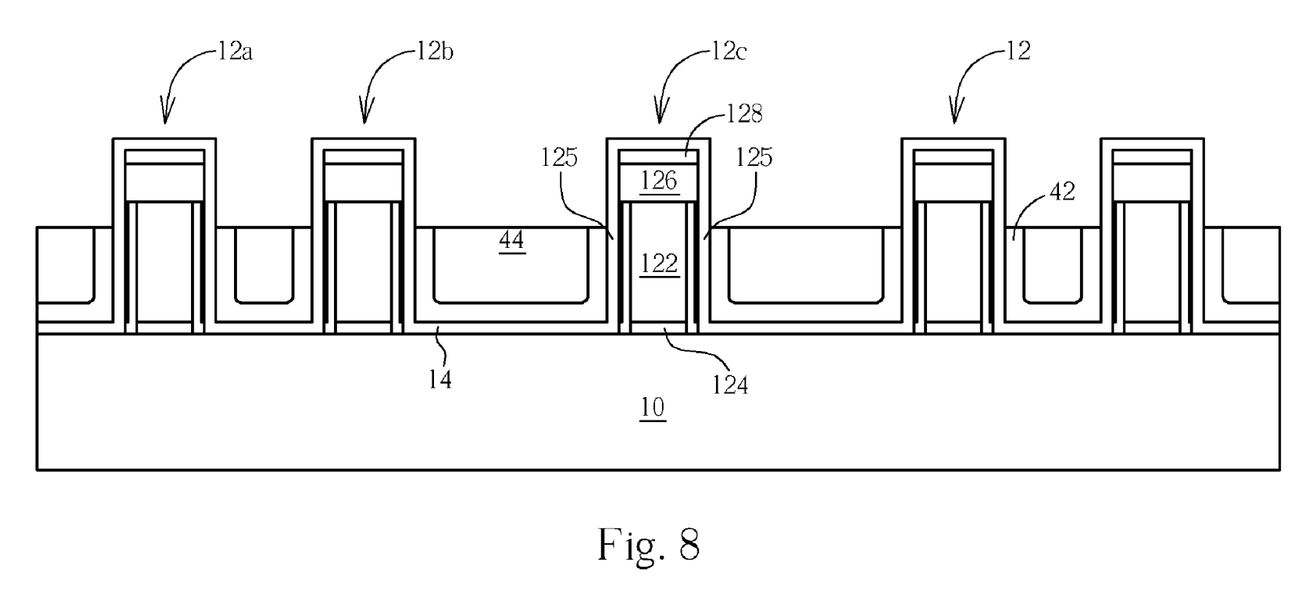

As shown in FIG. 8, subsequently, a wet etching process is carried out to removed the polysilicon layer 42 that is not covered by the sacrifying layer 44, which means that the exposed polysilicon layer 42 covering the protruding top portion of the gate structures 12 is removed. Thereafter, the remaining sacrifying layer 44 is completely removed.

Figure 9:
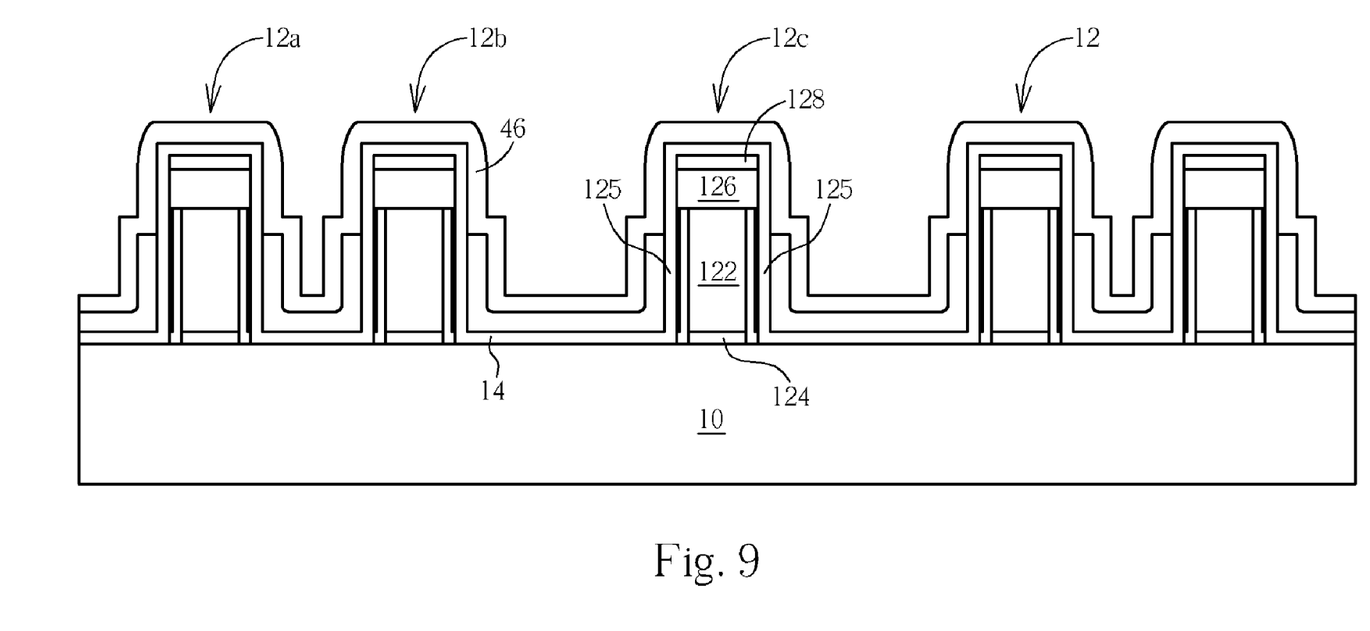

As shown in FIG. 9, a comformal silicon nitride layer 46 is blanket deposited on the surface of the substrate 10 and covers the remaining polysilocn layer 42 and the exposed top portions of the gate structures 12. According to preferred embodiment of this invention, the silicon nitride layer 46 may have a thickness ranging between 30 Å and 500 Å, which does not fill the spacing between the gate structures 12.

Figure 10:
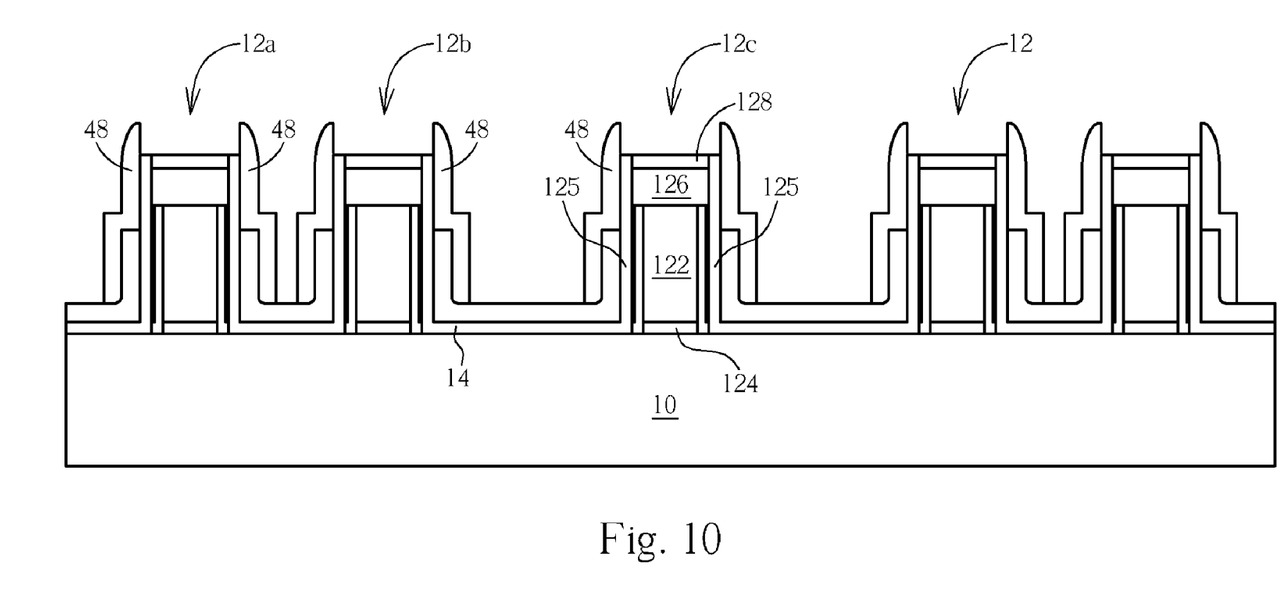

As shown in FIG. 10, subsequently, an anisotropic etching process is carried out to etch the silicon nitride layer 46 until the polysilicon layer 42 on the substrate 10 and the polysilicon cap layer 128 are exposed, thereby forming silicon nitride spacers 48 on sidewalls of the gate structures 12.

Figure 11:
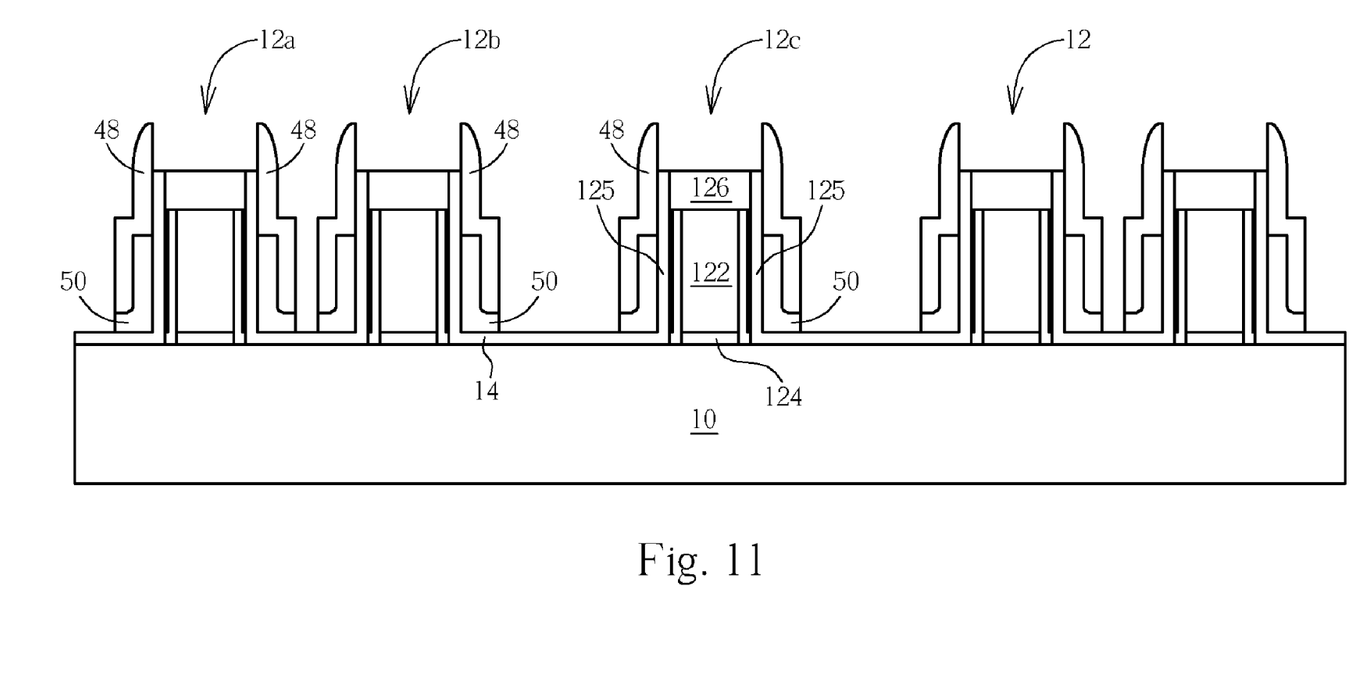

As shown in FIG. 11, another polysilicon etching is carried out to etch the polysilicon layer 42 and the polysilicon cap layer 128 that are not covered by the silicon nitride spacers 48 thereby forming a floating gate 50 on sidewalls of the gate structures 12.

Comparing to the prior art, one advantage of the present invention is that the thickness of the floating gate 50 is decided by the chemical vapor deposition process. Furthermore, the surface and the thickness of the flating gate 50 is not affected by the subsequence etching processes because the silicon nitride spacer 48 covers and protects the sidewall polysilicon layer 42 during the subsequent self-aligned floating gate etching. Therefore, the thickness and profile of the floating gate 50 can be precisely controlled.

Those skilled in the art will readily observe that numerous modifications and alterations of the device and method may be made while retaining the teachings of the invention.

What is claimed is:

1. A method for fabricating a flash memory device, comprising:

provideing a substrate having thereon a gate with therein a control gate;

lining the substrate and the gate with a liner;

forming a silicon layer on the liner;

forming a sacrificing layer on the silicon layer;

etching the sacrificing layer to expose a portion of the silicon layer;

removing the exposed silicon layer to expose a portion of the liner;

removing the sacrificing layer;

forming a spacer layer on the substrate, the spacer layer covering the remaining silicon layer and the exposed liner;

etching the spacer layer to form a spacer on sidewall of the gate; and removing the silicon layer that is not covered by the spacer thereby forming a floating gate on a sidewall of the gate.

2. The method according to claim 1, wherein the liner layer comprises a silicon oxide layer.

3. The method according to claim 1, wherein the silicon layer comprises polysilicon.

4. The method according to claim 1, wherein the scarifying layer comprises photoresist.

5. The method according to claim 1, wherein the spacer layer comprises silicon nitride.

6. The method according to claim 1, wherein the gate comprises a polysilicon top layer, and wherein the liner and the polysilicon top layer are removed while etching the silicon layer not covered by the spacer.

* * * * *